United States Patent
Lau et al.

(10) Patent No.: US 8,421,502 B2
(45) Date of Patent: Apr. 16, 2013

(54) POWER REDUCING LOGIC AND NON-DESTRUCTIVE LATCH CIRCUITS AND APPLICATIONS

(75) Inventors: Hon Shing Lau, Folsom, CA (US); Scott Siers, Elk Grove, CA (US); Ruchira Liyanage, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/270,912

(22) Filed: Nov. 10, 2005

(65) Prior Publication Data

US 2007/0103201 A1    May 10, 2007

(51) Int. Cl.
*H03K 19/00*    (2006.01)

(52) U.S. Cl.
USPC ............................ 326/93; 326/31; 327/208

(58) Field of Classification Search ............ 326/93, 326/95, 31, 33; 327/208–212, 218
See application file for complete search history.

(56) References Cited

U.S. PATENT DOCUMENTS

| | | | | |
|---|---|---|---|---|
| 4,749,991 A | * | 6/1988 | Davis et al. .................. | 340/5.28 |
| 5,337,285 A | * | 8/1994 | Ware et al. ................... | 365/227 |
| 5,485,580 A | * | 1/1996 | Takai et al. .................. | 709/250 |
| 5,629,643 A | * | 5/1997 | Moughanni et al. ......... | 327/199 |
| 6,275,083 B1 | * | 8/2001 | Martinez et al. ............. | 327/218 |
| 6,310,491 B1 | * | 10/2001 | Ogawa ........................ | 326/46 |
| 6,512,394 B1 | | 1/2003 | Parris | |
| 6,678,206 B2 | * | 1/2004 | Chu et al. .................... | 365/189.08 |
| 6,775,180 B2 | | 8/2004 | Biyani et al. | |
| 6,784,693 B2 | * | 8/2004 | Fan et al. ..................... | 326/81 |
| 6,822,478 B2 | * | 11/2004 | Elappuparackal ............ | 326/46 |
| 6,965,261 B2 | | 11/2005 | Tran et al. | |

FOREIGN PATENT DOCUMENTS

JP    2005-086215    3/2005

OTHER PUBLICATIONS

Non-Final Office Action mailed Mar. 28, 2011 for U.S. Appl. No. 12/847,248.
Final Office Action mailed Dec. 9, 2011 for U.S. Appl. No. 12/847,248.
Notice of Allowance mailed Apr. 4, 2012 for U.S. Appl. No. 12/847,248.
Notice of Allowance mailed Jun. 28, 2012 for U.S. Appl. No. 12/847,248.
Notice of Grant mailed Jan. 11, 2012 for Chinese Patent Application No. 200610064115.2.
First Office Action mailed Apr. 10, 2009 for Chinese Patent Application No. 200610064115.2.
Non-Final Office Action mailed Jun. 23, 2009 for Japanese Patent Application No. 2006-303994.
Non-Final Office Action mailed Oct. 20, 2009 for Japanese Patent Application No. 2006-303994.
Notice of Allowance mailed Mar. 9, 2010 for Japanese Patent Application No. 2006-303994.

* cited by examiner

*Primary Examiner* — James H Cho
(74) *Attorney, Agent, or Firm* — Blakely, Sokoloff, Taylor & Zafman LLP

(57) ABSTRACT

In some embodiments, a logic circuit is provided that has a plurality of gates with gate inputs. Also provided is one or more latch circuits coupled to the logic circuit to provide operational data when in an operational mode and to cause at least some of the gate inputs to be at values resulting in reduced leakage during a sleep mode. Additionally provided are embodiments of non-destructive latch circuits, which may be used to implement the latch circuits just discussed. Other embodiments are disclosed and/or claimed herein.

18 Claims, 5 Drawing Sheets

US 8,421,502 B2

POWER REDUCING LOGIC AND NON-DESTRUCTIVE LATCH CIRCUITS AND APPLICATIONS

BACKGROUND

Large scale integrated circuit chips such as microprocessors use circuits such as sequential logic circuits to implement many different types of logic functions. (As used herein, the term "chip," or die, refers to a piece of a material, such as a semiconductor material, that includes a circuit such as an integrated circuit or a part of an integrated circuit.) It is becoming ever more important to save power in chips, for example, with mobile applications or in other relatively low power environments. Unfortunately, as integrated circuits become larger and greater performance demands are placed on the chips, it is becoming even more difficult to reduce power consumption.

BRIEF DESCRIPTION OF THE DRAWINGS

Embodiments of the invention are illustrated by way of example, and not by way of limitation, in the figures of the accompanying drawings in which like reference numerals refer to similar elements.

DETAILED DESCRIPTION

Figure 1:
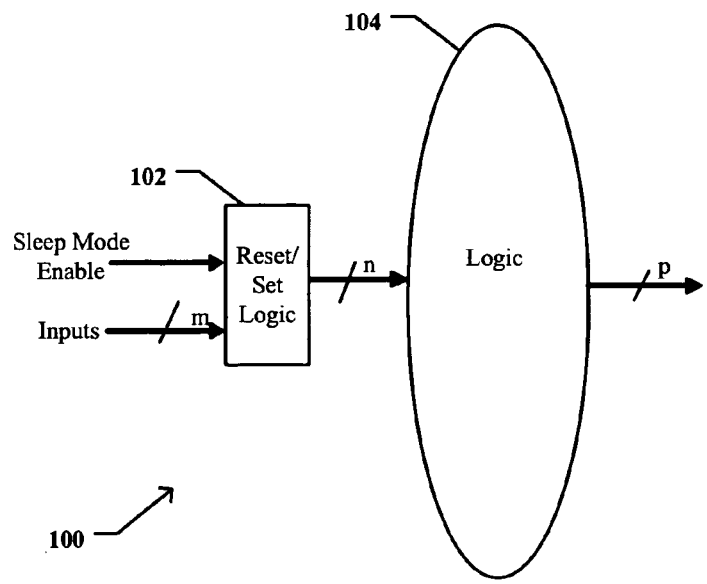
FIG. 1 is a block diagram of logic circuitry with a power reducing sleep mode feature according to some embodiments.

FIG. 1 is a block diagram showing logic circuits having a sleep mode feature in accordance with some embodiments disclosed herein. As indicated, reset/set latch circuitry 102 is coupled to logic circuits within logic circuitry 104 to provide operating inputs when the circuitry is in operation and to set or reset the logic circuits to known, sleep mode states when in a sleep mode. The sleep mode is entered with the assertion of the Sleep Mode Enable signal, which may actually comprise one or more signals that may be asserted Low and/or High. (It should be appreciated that a set or a reset latch may include any latch circuit that is capable of outputting a known logic value in response to an asserted control signal. Typically, the control input is referred to as an R or an S input, however in this disclosure, it is referred to as a Sleep Mode Enable signal.)

When a sleep mode is entered, inputs to the logic circuits are set or reset so that they consume reduced overall leakage power. The logic circuits can comprise numerous gates (e.g., NAND, NOR) that even though not being operated, may consume different amounts of leakage power depending upon their inputs. For example, a n-input NAND gate (e.g., implemented with PMOS devices) with inputs being all High may have less leakage (e.g., about ten times) than with its inputs all being Low. Thus, during a sleep mode, it is desirable to set such NAND gate inputs High. On the other hand, other gates (e.g., n-input PMOS NOR gates) may leak less with their inputs all being Low. Thus, with such gates, it would be desirable to reset their inputs Low. (The term "PMOS transistor" refers to a P-type metal oxide semiconductor field effect transistor. Likewise, "NMOS transistor" refers to N-type metal oxide semiconductor field effect transistor. It should be appreciated that whenever the terms: "transistor", "MOS transistor", "NMOS transistor", or "PMOS transistor" are used, unless otherwise expressly indicated or dictated by the nature of their use, they are being used in an exemplary manner. They encompass the different varieties of MOS devices including devices with different VTs and oxide thicknesses to mention just a few. Moreover, unless specifically referred to as MOS or the like, the term transistor can include other suitable transistor types, e.g., junction-field-effect transistors, bipolar-junction transistors, and various types of three dimensional transistors, known today or not yet developed.)

It may not be possible to so set or reset the inputs for all of the gates in logic block 104 during a sleep mode, but at least some may be set/reset to reduce the overall leakage. In some embodiments, e.g., during a design phase, the topology and/or circuit style may be changed, for example, by using DeMorgan's theorem to replace NAND with NOR gates or vice versa so that in the sleep mode, even lower leakage, given available input combinations, may be achieved. Notwithstanding the fact that the reset/set latch circuits 102 are shown as all being "ahead" of the logic block 104, in some embodiments, reset and set circuits may also (or otherwise) be disposed within the logic block 104 to allow for more gate inputs to be suitably set or reset to attain possibly better leakage reduction.

When the logic block 104 is being operated (not in a sleep mode), the "Sleep Mode Enable" signal is de-asserted, and the R/S latches 102 operate as normal latches coupling input data to the logic circuitry 104. Conversely, upon entrance of a sleep mode, the "Sleep Mode Enable" signal(s) is asserted causing the set/reset latches 102 to set or reset logic circuit inputs, which causes them to enter the reduced leakage states. In some embodiments, non-destructive reset and/or set latch circuits (for which some embodiments are disclosed below) are utilized so that when the logic block 104 is to come out of the sleep mode, the set/reset circuits 102 can return the logic circuit inputs to their operating states when the sleep mode was entered.

Figure 2A:
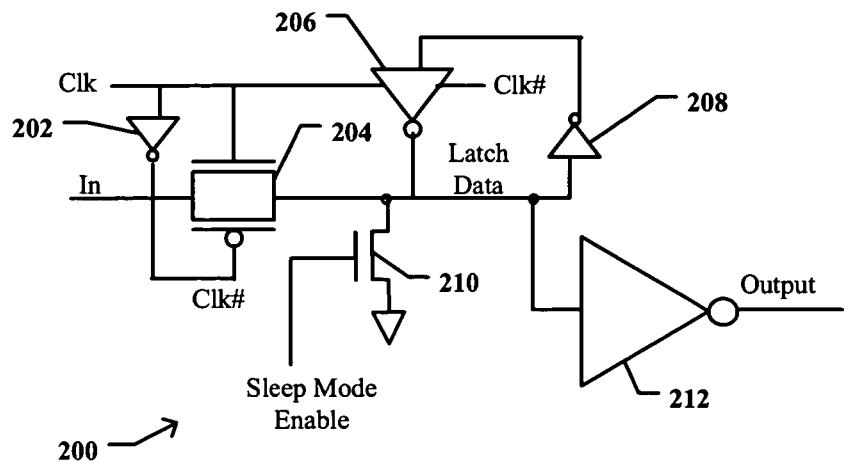
FIG. 2A is a schematic diagram of a conventional set latch circuit.

FIG. 2A shows a conventional, destructive set latch 200, which may be used to implement some of the set latch circuits discussed above. Set latch 200 comprises inverters 202, 208, and 212, pass gate 204, tri-state inverter 206, and an NMOS transistor 210, coupled together as indicated. When the circuit is not in a sleep mode (the sleep mode enable signal is de-asserted Low), the circuit operates as a latch. When the clock (Clk) is High, the passgate 204 turns on (passing the input (In) value to the "Latch Data" node, and the tri-state inverter 206 is in a tri-state mode (which allows the Latch Data node value to change). Conversely, when the clock is Low, the passgate 204 turns off, and the tri-state inverter 206 turns on, acting as an inverter, to hold (or latch) the Latch Data node value. Thus, upon a High to Low clock transition, the input (In) value is "latched" at the Latch Data node. The latch output (Output) is at the output of inverter 212, which buffers and inverts the value at the Latch Data node. When a sleep mode is entered, the Sleep Mode Enable input asserts (goes High), causing the Latch Data node to go Low and the latch output (Out) to go High (or to set). (Note that the inverter 212 will typically be suitably larger than the other inverters to sufficiently drive the output signal. Likewise, depending on the operation of tri-state inverter 206, e.g., the clock may be deactivated during a sleep mode, the transistor 210 should be sufficient to pull down the Latch Data node upon entry into a sleep mode.)

Figure 2B:
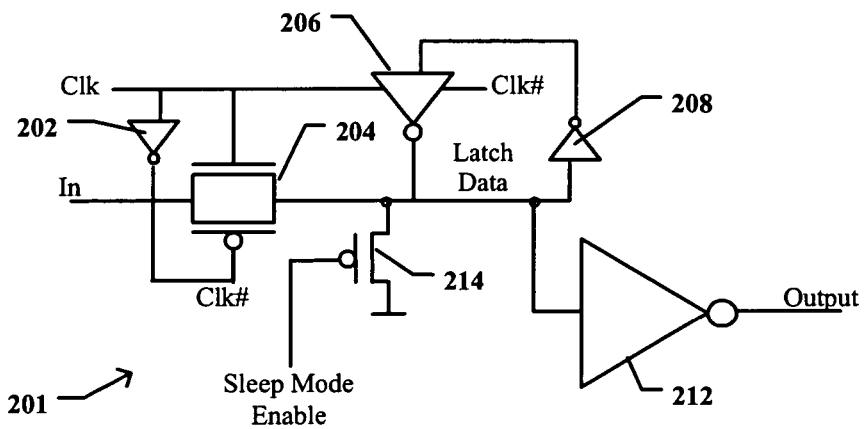
FIG. 2B is a schematic diagram of a conventional reset latch circuit.

FIG. 2B shows a conventional reset latch circuit 201, which may be suitable for implementing one or more of the reset circuits in the reset/set circuitry 102. Reset latch 201 is the same as Set latch 200 except that it includes a PMOS transistor 214 (instead of an NMOS transistor 210) coupling the Latch Data node to a High supply (e.g., VCC) instead of to a Low reference (e.g., ground). Thus, with the reset circuit, the Sleep Mode Enable signal is asserted when it is Low and when entered, it causes the Latch Data node to go High, which causes the output to go Low (or reset).

Figure 3:
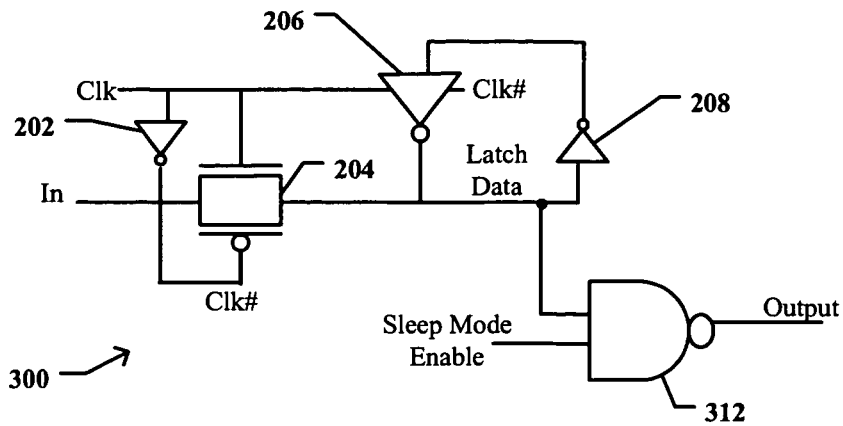
FIG. 3 is a schematic diagram of a non-destructive set latch in accordance with some embodiments.

FIG. 3 shows a novel non-destructive set latch circuit 300 according to some embodiments. Set latch 300 may be used, for example, for one or more of the set circuits in set/reset circuitry 102. In some embodiments, it may be desired since it does not lose the value at the Latch Data node when entering a sleep mode. Set latch 300 is generally similar to set latch 200 except that it includes NAND gate 312 in place of transistor 210 and output inverter 212. The sleep mode is entered by asserting (Low) the Sleep Mode Enable signal, which causes the output of NAND gate 312 to go High, regardless of the value at the Latch Data node. On the other hand, when the Sleep Mode Enable signal is de-asserted (High), the circuit acts as a latch. (Note that in the depicted embodiment, the clock is kept Low during a sleep mode to maintain the value at the Latch Data node. In other embodiments, this may not be the same or necessary.)

Figure 4:
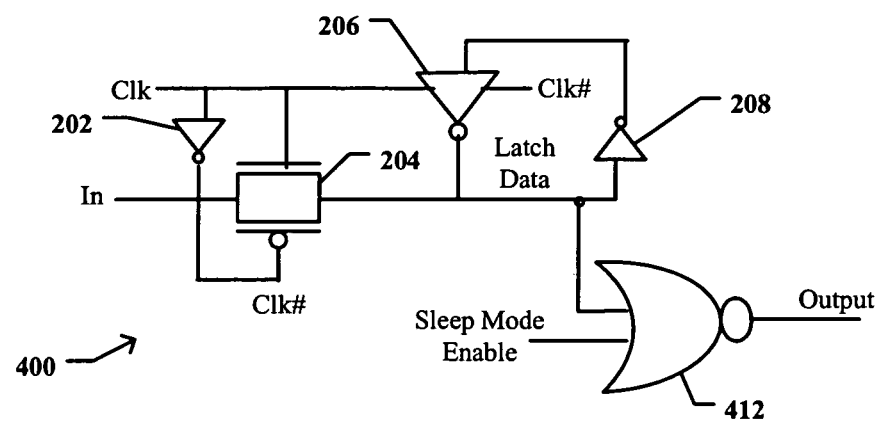
FIG. 4 is a schematic diagram of a non-destructive reset latch in accordance with some embodiments.

FIG. 4 shows a novel non-destructive reset latch circuit 400 according to some embodiments. Reset latch 400 may be used, for example, for one or more of the reset circuits in set/reset circuitry 102. In some embodiments, it may be desired since it does not lose the value at the Latch Data node when entering a sleep mode. Reset latch 400 is generally similar to reset latch 201 except that it includes NOR gate 412 in place of sleep mode, pull-up transistor 214 and output inverter 212. The sleep mode is entered by asserting (High) the Sleep Mode Enable signal, which causes the output of NOR gate 412 to go Low, regardless of the value at the Latch Data node. On the other hand, when the Sleep Mode Enable signal is de-asserted (Low), the circuit acts as a latch. (Again, in the depicted embodiment, the clock is kept Low during a sleep mode to maintain the value at the Latch Data node. In other embodiments, this may not be the same or necessary.)

Figure 5A:
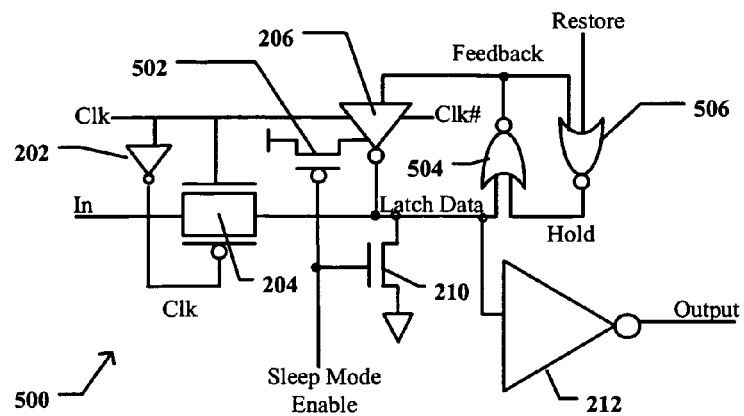
FIG. 5A is a schematic diagram of a non-destructive set latch in accordance with some embodiments.
Figure 5B:
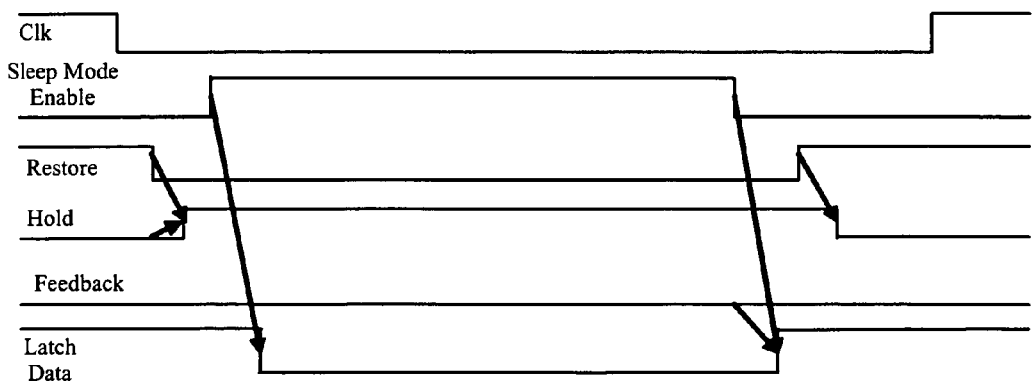
FIG. 5B is a timing diagram illustrating the operation of the circuit of FIG. 5A in accordance with some embodiments.

With reference to FIGS. 5A and 5B, a novel, non-destructive set latch 500 (FIG. 5A) and a corresponding timing diagram (FIG. 5B) illustrating its operation in accordance with some embodiments, are shown. The set latch 500 is similar to set latch 200 except that it incorporates a restore circuit (formed from cross-coupled NOR gates 504 and 506) to store the Latch Data node value during a sleep mode. (As used herein, a restore circuit may comprise any suitable combination of gates and/or other devices to store the value from the Latch Data node during a sleep mode and provide it back to the Latch Data node when the sleep mode is departed.) Latch circuit 500 also includes a transistor 502 to controllably disable a supply reference (VCC) to the tri-state inverter 206 during the sleep mode. It may be appreciated that in this embodiment, inverter 212 is used as the output driving gate instead of a NAND gate (as with set latch 300), which may make it better suited for some applications, e.g., where greater output drive capability is desired.

When the set latch 500 operates in a latch mode (not sleep mode), the Restore and Sleep Mode Enable signals are de-asserted (Restore is High and Sleep Mode Enable is Low). When the Sleep Mode Enable signal is de-asserted (Low), transistor 210 turns off (allowing the Latch Data node to carry the input, In, value), while transistor 502 turns on to turn on the tri-state inverter 206. The Restore signal being de-asserted (High) causes a Low at the output of NOR gate 506, which causes NOR gate 504 to act as an inverter with the State value as its input. Thus, when not in the sleep mode, latch circuit 500 essentially operates like latch circuit 200 when latch circuit 200 is not in a sleep mode.

As seen in FIG. 5B, when the sleep mode is entered, the Restore signal is asserted (Low). This causes the Latch Data node value to be stored in the restore circuit (cross-coupled NOR gates 504, 506). This is followed by the assertion of the Sleep Mode Enable signal (High), which turns off the tri-state inverter 206 and pulls down the Latch Data node thereby "setting" the Output High.

When the latch 500 is to depart from the sleep mode, the Sleep Mode Enable signal is de-asserted (Low) turning on the tri-state inverter 206, while at the same time, turning off transistor 210 thereby causing the Latch Data node value to be at its value at the time the sleep mode was entered. The Restore signal is then de-asserted (High), and the circuit once again (depending on the Clk signal) can function as a latch.

Figure 6A:
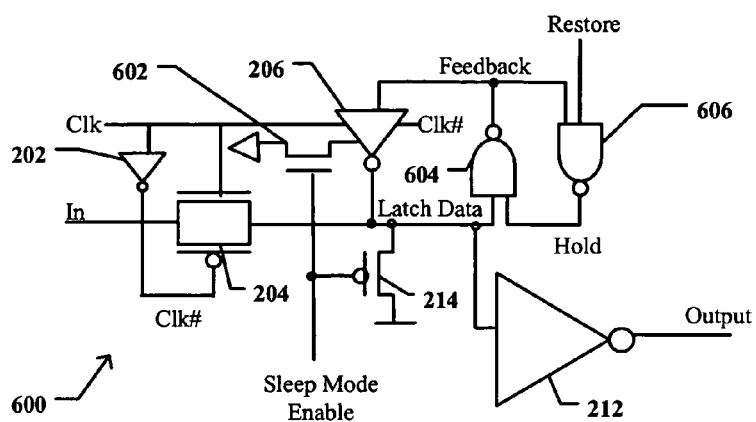
FIG. 6A is a schematic diagram of a non-destructive reset latch in accordance with some embodiments.
Figure 6B:
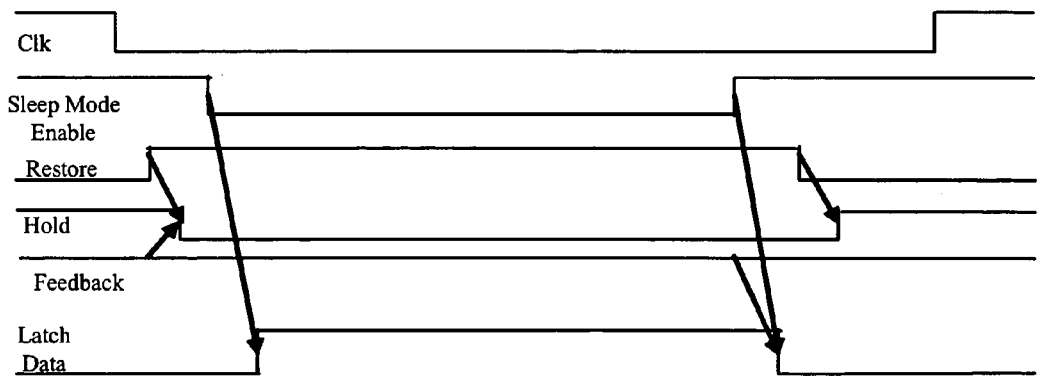
FIG. 6B is a timing diagram illustrating the operation of the circuit of FIG. 6A in accordance with some embodiments.

With reference to FIGS. 6A and 6B, a novel, non-destructive reset latch 600 (FIG. 6A) and a corresponding timing diagram (FIG. 6B) illustrating its operation in accordance with some embodiments, are shown. It is similar to set latch 500 except in the following respects. It is a reset latch, so when the sleep mode is entered, the Output is Low instead of High. In addition, its restore circuit is formed from cross-coupled NAND gates 604, 606 (rather than NOR gates), its sleep mode transistor 214 is a PMOS device rather than an NMOS device, and its supply reference transistor 602 is an NMOS device controllably coupling a ground reference to the tri-state inverter 206 rather than a PMOS device coupling a VCC supply. Accordingly, the Sleep Mode Enable signal is de-asserted when it is High, and the Restore signal is de-asserted when Low.

Thus, as shown in the timing diagram of FIG. 6B, when the Sleep Mode Enable signal is de-asserted (High) and the Restore signal is de-asserted (Low), latch 600 operates as a latch. When the sleep mode is entered, the Restore signal is asserted (High) to store the value at the Latch Data node in the restore circuit (NAND gates 604, 606), and the Sleep Mode Enable signal is subsequently asserted (Low) to enter the sleep mode and cause the Output to go Low. When coming out of the sleep mode, the Sleep Mode Enable signal is de-asserted (High), and the Restore signal is then de-asserted (Low) to place the Latch Data node at its value when the sleep mode was entered.

Figure 7:
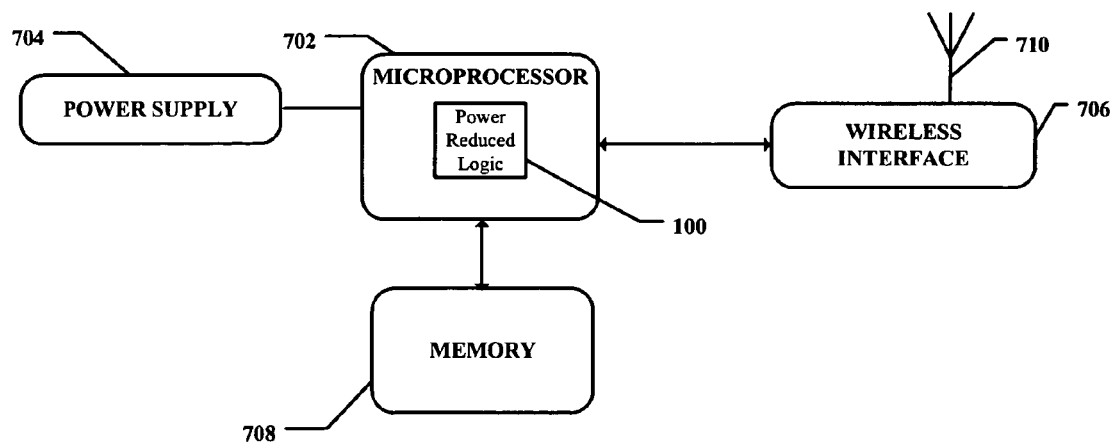
FIG. 7 is a block diagram of a computer system with at least one logic circuit with a power reducing feature in accordance with some embodiments.

With reference to FIG. 7, one example of a computer system is shown. The depicted system generally comprises a processor 702 that is coupled to a power supply 704, a wireless interface 706, and memory 708. It is coupled to the power supply 704 to receive from it power when in operation. The wireless interface 706 is coupled to an antenna 410 to communicatively link the processor through the wireless interface chip 706 to a wireless network (not shown). Microprocessor 702 comprises a power reduced logic block 100, in accordance with embodiments described above, comprising a variety of logic circuits that are controlled to enter known power-reducing states during a sleep mode.

It should be noted that the depicted system could be implemented in different forms. That is, it could be implemented in a single chip module, a circuit board, or a chassis having multiple circuit boards. Similarly, it could constitute one or more complete computers or alternatively, it could constitute a component useful within a computing system.

The invention is not limited to the embodiments described, but can be practiced with modification and alteration within the spirit and scope of the appended claims. For example, it should be appreciated that the present invention is applicable for use with all types of semiconductor integrated circuit ("IC") chips. Examples of these IC chips include but are not limited to processors, controllers, chip set components, programmable logic arrays (PLA), memory chips, network chips, and the like.

Moreover, it should be appreciated that example sizes/models/values/ranges may have been given, although the present invention is not limited to the same. As manufacturing techniques (e.g., photolithography) mature over time, it is expected that devices of smaller size could be manufactured. In addition, well known power/ground connections to IC chips and other components may or may not be shown within the FIGS. for simplicity of illustration and discussion, and so as not to obscure the invention. Further, arrangements may be shown in block diagram form in order to avoid obscuring the invention, and also in view of the fact that specifics with respect to implementation of such block diagram arrangements are highly dependent upon the platform within which the present invention is to be implemented, i.e., such specifics should be well within purview of one skilled in the art. Where specific details (e.g., circuits) are set forth in order to describe example embodiments of the invention, it should be apparent to one skilled in the art that the invention can be practiced without, or with variation of, these specific details. The description is thus to be regarded as illustrative instead of limiting.

What is claimed is:

1. A system comprising:
a microprocessor comprising:
a logic circuit having a plurality of gate data inputs, and
clocked, non-destructive data latch circuits with data outputs coupled to the gate data inputs to provide operational latched data when in an operational mode and to provide a predetermined combination of low and/or high logic values to the logic gate data inputs during a reduced power mode, wherein the clocked non-destructive latch circuits are operable to maintain the operational latched data during the reduced power mode;
an antenna; and
a wireless interface coupled to the microprocessor and to the antenna to communicatively link the microprocessor to a wireless network.

2. The system of claim 1, in which the logic circuit comprises one or more sequential logic circuits.

3. The chip of claim 1, in which the non-destructive latch circuits comprise non-destructive R and S latches.

4. A chip comprising:
a plurality of logic gates having data inputs; and
non-destructive, clocked data latches with data outputs coupled to the data inputs of the logic gates to provide operational latched data when in an operational mode and to provide a predetermined combination of low and/or high logic values to the data inputs of the plurality of logic gates during a reduced power mode, wherein the non-destructive clocked data latches are operable to maintain the operational latched data during the reduced power mode.

5. The chip of claim 4, in which the plurality of logic gates comprises one or more sequential logic circuits.

6. The chip of claim 4, in which the non-destructive clocked data latches comprise non-destructive R and S data latches.

7. The chip of claim 4, wherein the non-destructive clocked data latches comprise a NOR gate as an output driver, wherein the NOR gate to receive the operational latched data and an enable signal.

8. The chip of claim 4, wherein the non-destructive clocked data latches comprise a NAND gate as an output driver, wherein the NAND gate to receive the operational latched data and an enable signal.

9. The chip of claim 4, further comprising:
a pass-gate controllable by complementary clock signals received at its gate terminals, the pass-gate having a first terminal to receive an input and a second terminal to provide an output;
a clock gated inverter with an input and an output, the output coupled to the second terminal of the pass-gate; and
a power transistor to switch on/off power to the clock gated inverter via an enable signal.

10. The apparatus of claim 9 further comprises a logic unit coupled to the input and output of the clock gated inverter, the logic unit comprising feedback coupled logic gates.

11. The apparatus of claim 10, wherein the feedback coupled logic gates comprises first and second logic gates that are one of NOR or NAND gates.

12. The apparatus of claim 11, wherein the first logic gate receives a control signal and an output signal from the second logic gate.

13. The apparatus of claim 12, wherein the clock gated inverter receives the output signal from the second logic gate.

14. The apparatus of claim 11, wherein the second logic gate receives an input from the second terminal and from the first logic gate.

15. The apparatus of claim 9 further comprises a pull-down transistor coupled to the second terminal and controllable by the enable signal.

16. The apparatus of claim 15, wherein the pull-down transistor is an n-type transistor.

17. The apparatus of claim 9, wherein the power transistor is a p-type transistor.

18. The apparatus of claim 9 further comprises an inverter or a buffer coupled to the second terminal.

* * * * *